United States Patent
Al-Absi

(10) Patent No.: US 12,155,361 B2
(45) Date of Patent: Nov. 26, 2024

(54) VCII BASED TUNABLE POSITIVE AND NEGATIVE IMPEDANCE SIMULATOR AND IMPEDANCE MULTIPLIER

(71) Applicant: KING FAHD UNIVERSITY OF PETROLEUM AND MINERALS, Dhahran (SA)

(72) Inventor: Muneer A. Al-Absi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 298 days.

(21) Appl. No.: 17/960,485

(22) Filed: Oct. 5, 2022

(65) Prior Publication Data
US 2024/0154606 A1    May 9, 2024

(51) Int. Cl.
| | | |
|---|---|---|
| *H03H 11/48* | (2006.01) | |
| *H03H 11/46* | (2006.01) | |
| *H03H 11/52* | (2006.01) | |

(52) U.S. Cl.
CPC ......... *H03H 11/483* (2013.01); *H03H 11/481* (2013.01); *H03H 11/488* (2013.01); *H03H 11/52* (2013.01); *H03H 11/53* (2013.01)

(58) Field of Classification Search
CPC ...... H03H 11/52; H03H 11/481; H03H 11/53; H03H 11/483; H03H 11/025; H03H 11/048; H03H 11/0466
USPC .............................................. 333/213–217
See application file for complete search history.

(56) References Cited

U.S. PATENT DOCUMENTS

2017/0149415 A1    5/2017    Abuelma'Atti et al.

OTHER PUBLICATIONS

Ferri, et al. ; New Resistor-Less Electronically Controllable _C Simulator Employing VCII, DVCC, and a Grounded Capacitor ; MDPI electronics ; Jan. 17, 2022 ; 14 Pages.
Safari, et al. ; Realization of an Electronically Tunable Resistor-Less Floating Inductance Simulator Using VCII ; MDPI Electronics ; Jan. 19, 2022 ; 15 Pages.
Al-Shahrani, et al. ; Efficient Inverse Filters based on Second-Generation Voltage Conveyor (VCII). ; Arabian Journal for Science & Engineering ; vol. 43, Issue 3 ; pp. 2685-2690 ; Mar. 2022 ; Abstract Only ; 1 Page.

*Primary Examiner* — Rakesh B Patel
(74) *Attorney, Agent, or Firm* — Oblon, McClelland, Maier & Neustadt, L.L.P.

(57) ABSTRACT

A tunable impedance simulator and impedance multiplier circuit and a system for configuring a second generation voltage-mode conveyor circuit (VCII) as the tunable impedance simulator and impedance multiplier are described. The tunable impedance simulator and impedance multiplier circuit includes one VCII having a positive input terminal connected to a voltage source, a negative input terminal connected to the voltage source, and an impedance terminal $Z_0$. The impedance terminal $Z_0$ can be either positive or negative. When the impedance terminal $Z_0$ is positive, a positive active inductor, a positive capacitance multiplier, and a positive resistance multiplier may be implemented. When the impedance terminal $Z_0$ is negative, a negative active inductor, a negative capacitance simulator, and a negative resistance simulator may be implemented.

20 Claims, 10 Drawing Sheets

VCII BASED TUNABLE POSITIVE AND NEGATIVE IMPEDANCE SIMULATOR AND IMPEDANCE MULTIPLIER

STATEMENT REGARDING PRIOR DISCLOSURE BY THE INVENTORS

Aspects of the present disclosure were described in an article "A VCII Based Tunable Positive and Negative Impedance Simulator and Impedance Multiplier" TechRXIV (2022), May 2, 2022, which is incorporated herein by reference in its entirety.

CROSS REFERENCE TO RELATED APPLICATIONS

Aspects of this technology are described in a U.S. patent application Ser. No. 17/901,434, filed on Sep. 1, 2022, which is incorporated herein in its entirety.

STATEMENT OF ACKNOWLEDGEMENT

The inventors acknowledge the support provided by the King Fahd University of Petroleum & Minerals KFUPM), Riyadh, Saudi Arabia.

BACKGROUND

Technical Field

The present disclosure is directed to a second-generation voltage-mode conveyor (VCII) based tunable positive and negative impedance simulator and impedance multiplier.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Tunable filters are used in electronic systems to control receiving or transmitting frequencies to lie within a frequency range. In the tunable filters, an operating frequency can be tuned in a controlled manner, thereby providing flexibility for use in different applications. Tunable filters are used in different applications including but not limited to, base stations, mobile devices, instrumentation, industrial electronics, military electronics, laptop computers, tablets, digital radios, and compact and/or portable instruments.

Simulated inductor and impedance scaling circuits are used in devices such as active filters, oscillators, phase shifters, and the like. The advantages of the simulated inductor include integration, low area, and high quality factor. The capacitive multiplier also finds wide applications in capacitive interfaces and other analog circuits requiring large value capacitors. Recent advancements in CMOS technology allow integrating different types of circuits into a single chip, resulting in reducing the size and weight of the device. For a linear integrated circuit, the basic physical circuit elements include resistors, capacitors, and transistors. In modern circuit analysis and synthesis, a current conveyor (CCII) is considered a universal functional circuit element. The current conveyor can provide better gain-bandwidth products than comparable op-amps under both small and large signal conditions. However, the CCII (also known as a current-mode active building block) lacks a low-impedance voltage output port and does not provide an output signal in a voltage form. Thus, a CCII requires an extra voltage buffer at the output.

Recently, a new active building block (ABB), called a second generation voltage conveyor (VCII) has been used in many analog signal processing applications. Like the CCII, the operation of VCII is based on current-mode signal processing. Thus the VCII offers most of the advantages provided by CCII. The VCII has a low impedance voltage output port, a low impedance current input terminal, and a high impedance current output terminal, which offers more flexibility in applications such as the designing of various types of filters. The VCII is useful in different circuits, such as impedance simulators, filters, rectifiers, oscillators, and the like. There are various types of simulated inductors available in the industry. Most commercially available inductor simulators, for example, use a large number of elements, such as floating capacitors and commercially available ICs. For example, a conventional VCII-based simulated grounded inductor uses a plus type VCII (VCII+) and one negative type VCII (VCR−) in addition to three passive components to realize an active inductor. However, conventional voltage conveyor circuits are not suitable for being used over a wide frequency range.

Accordingly, it is one object of the present disclosure to provide a tunable impedance simulator and impedance multiplier circuit using a single VCII, which is capable of being used in different frequency ranges.

SUMMARY

In an exemplary embodiment, a tunable impedance simulator and impedance multiplier circuit is described. The tunable impedance simulator and impedance multiplier circuit includes one second generation voltage-mode conveyor circuit (VCII) configured with a positive input terminal Y, an impedance input terminal $Z_0$, a negative input terminal, an impedance output terminal Z, and a signal output terminal X. The impedance input terminal $Z_0$, is configured to be selectable between a positive input impedance terminal and a negative input impedance terminal. The VCII has a current gain $\beta$, and a voltage gain $\alpha$. Further, the tunable impedance simulator and impedance multiplier circuit includes a first impedance $Z_1$ connected to the positive input terminal Y, a voltage source $V_s$, connected to the first impedance $Z_1$, the impedance input terminal $Z_0$, and the negative input terminal, a second impedance $Z_2$ having a first contactor connected to the signal output terminal X and a second contactor connected to a ground, and a third impedance $Z_3$ having a first contactor connected to the impedance output terminal Z, and a second contactor connected to the ground. The VCII is configured to be tunable by selecting values for $Z_1$, $Z_2$, and $Z_3$.

In another exemplary embodiment, a method for implementing a tunable impedance simulator and impedance multiplier circuit is described. The method includes selecting one second generation voltage-mode conveyor circuit (VCII) configured with a positive input terminal Y, an impedance input terminal $Z_0$, a negative input terminal, an impedance output terminal Z, and a signal output terminal X, wherein the impedance input terminal $Z_0$ is configured to be selectable between a positive input impedance terminal and a negative input impedance terminal, and wherein the VCII has a current gain $\beta$ and a voltage gain $\alpha$. The method includes connecting a first impedance $Z_1$ to the positive input terminal Y, wherein an internal circuit of the first impedance $Z_1$ comprises a resistor $R_1$ in parallel with a capacitor $C_1$. The method further includes connecting a voltage source $V_s$ to the first impedance $Z_1$, the impedance input terminal $Z_0$, and the negative input terminal. The method further includes connecting a first contactor of a second impedance $Z_2$ to the signal output terminal X and a second contactor of the second impedance to a ground, wherein an internal circuit of the second impedance $Z_2$ comprises a resistor $R_2$ in parallel with a capacitor $C_2$. The method further includes connecting a first contactor of a third impedance $Z_3$ to the impedance output terminal Z, and a second contactor of the third impedance to the ground, wherein an internal circuit of the third impedance $Z_3$ consists of a resistor $R_3$. The method further includes generating, with the voltage source $V_s$, a voltage signal having an amplitude $|V_s|$ at a frequency s. The method further includes tuning the VCII by selecting values for $R_1$, $C_1$, $R_2$, $C_2$, and $R_3$.

In another exemplary embodiment, a system for configuring a second generation voltage-mode conveyor circuit (VCII) as a tunable impedance simulator and impedance multiplier is described. The system includes one second generation voltage-mode conveyor circuit (VCII), a first impedance $Z_1$, a voltage source $V_s$, a second impedance $Z_2$, and a third impedance $Z_3$. The VCII includes a positive input terminal Y, an impedance input terminal $Z_0$, a negative input terminal, an impedance output terminal Z and a signal output terminal X, wherein the impedance input terminal $Z_0$ is configured to be selectable between a positive input impedance terminal and a negative input impedance terminal, where the VCII has a current gain β and a voltage gain α. The first impedance $Z_1$ is connected to the positive input terminal Y, wherein an internal circuit of the first impedance $Z_1$ comprises a resistor $R_1$ in parallel with a capacitor $C_1$. The voltage source $V_s$ connected to the first impedance $Z_1$, the impedance input terminal $Z_0$ and the negative input terminal, wherein the voltage source $V_s$ is configured to generate a voltage signal having an amplitude $|V_s|$ at a frequency s. The second impedance $Z_2$ having a first contactor connected to the signal output terminal X and a second contactor connected to a ground, wherein an internal circuit of the second impedance $Z_2$ comprises a resistor $R_2$ in parallel with a capacitor $C_2$. The third impedance $Z_3$ having a first contactor connected to the impedance output terminal Z and a second contactor connected to the ground wherein an internal circuit of the third impedance $Z_3$ consists of a resistor $R_3$. The VCII is configured to be tunable by selecting values for $R_1$, $C_1$, $R_2$, $C_2$, and $R_3$, such that when the impedance input terminal $Z_0$ is configured to be a positive input impedance terminal, an input impedance $Z_{in}$ to the VCII is given by $$Z_{in} = \frac{Z_1 Z_3}{Z_2},$$

any one of: a tunable active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$, a tunable capacitance multiplier is configured by setting $Z_1=1/sC_1$, $R_1=0$, $Z_2=R_2$, $C_2=0$, and $Z_3=R_3$, such that the input impedance is given by $$Z_{in} = \frac{1}{sC_1\frac{R_2}{R_3}},$$

where the capacitance $C_1$ is multiplied by $R_2/R_3$, and an amount of multiplication of $C_1$ is tuned by a selection of a value of $R_2$ and a value of $R_3$, and a tunable resistance multiplier is configured by setting $Z_1=R_1$, $C_1=0$, $Z_2=R_2$, $C_2=0$, and $Z_3=R_3$, such that the input impedance is given by $$Z_{in} = R_1\frac{R_3}{R_2},$$

where $R_1$ is multiplied by $R_3/R_2$, and an amount of multiplication of $R_1$ is tuned by a selection of a value of $R_2$ and a value of $R_3$. When the impedance input terminal $Z_0$ is configured to be a negative input impedance terminal, an input impedance $Z_{in}$ to the VCII is given by $$Z_{in} = -\frac{Z_1 Z_3}{Z_2},$$

any one of: a tunable negative active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$, a tunable negative capacitance simulator is configured by setting $Z_1=1/sC_1$, $R_1=0$, $Z_2=R_2$, $C_2=0$, and $Z_3=R_3$, such that the input impedance is given by $$Z_{in} = -\frac{1}{sC_1\frac{R_2}{R_3}},$$

where the capacitance, $C_1$, is multiplied by $R_2/R_3$, and an amount of multiplication of $C_1$ is tuned by a selection of a value of $R_2$ and a value of $R_3$, and a tunable negative resistance simulator is configured by setting $Z_1=R_1$, $C_1=0$, $Z_2=R_2$, $C_2=0$, and $Z_3=R_3$, such that the input impedance is given by $$Z_{in} = -R_1\frac{R_3}{R_2},$$

where $R_1$ is multiplied by $R_3/R_2$, and an amount of multiplication of $R_1$ is tuned by a selection of a value of $R_2$ and a value of $R_3$. The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
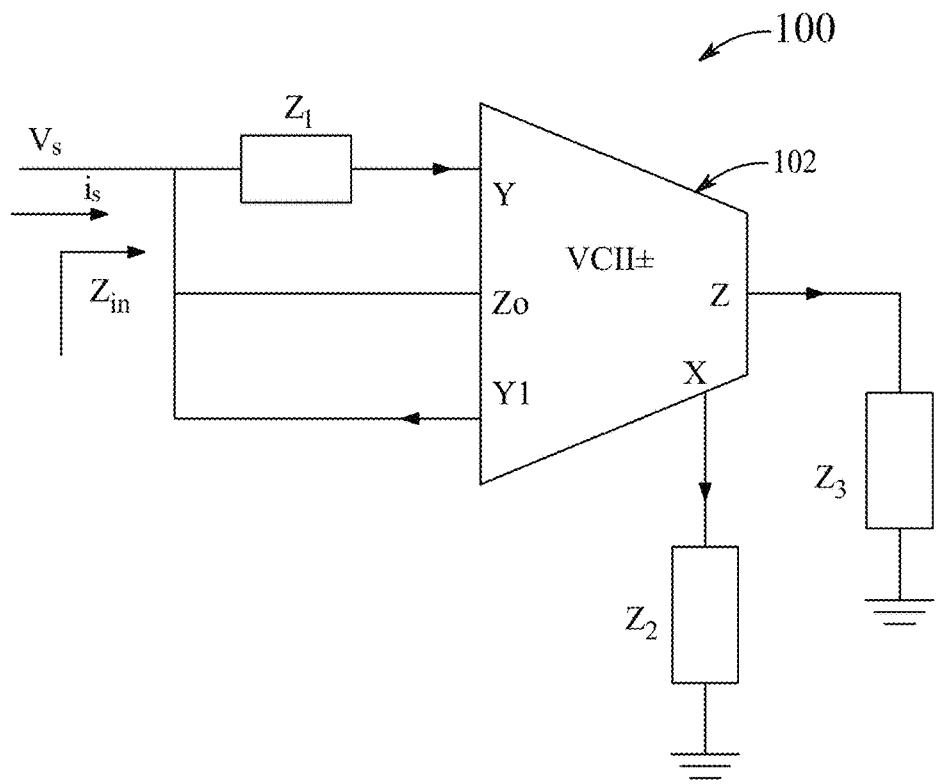
FIG. 1A is a diagram illustrating an exemplary configuration of a tunable impedance simulator and impedance multiplier circuit, according to aspects of the present disclosure.

In the drawings, like reference numerals designate identical or corresponding parts throughout the several views.

Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a tunable impedance simulator and impedance multiplier circuit, and a method for implementing the tunable impedance simulator and impedance multiplier circuit. The tunable impedance simulator and impedance multiplier circuit includes a second generation voltage-mode conveyor circuit (VCII) having a positive input terminal connected to a voltage source, a negative input terminal connected to the voltage source, and an impedance terminal $Z_O$ which can either be a positive terminal or a negative terminal, such that a positive active inductor simulator, positive capacitance multiplier and positive resistance multiplier is implemented when the impedance terminal $Z_O$ is positive and a negative active inductor simulator, negative capacitance simulator, and negative resistance simulator can be implemented when the impedance terminal $Z_O$ is negative.

In various aspects of the disclosure, non-limiting definitions of one or more terms that will be used in the document are provided below.

The term "second-generation voltage-mode conveyor (VCII)" is defined as a dual circuit of a second-generation current conveyor (CCII), which provides the possibility of processing signals in the current domain while providing output signals in the voltage form. The VCII includes Y and X ports (input terminals) and Z port (output terminal). Y is a low-impedance current input port and X is a high-impedance current output port. For VCII, β is a current gain between the Y and X ports and α is a voltage gain between the X and Z ports. $V_x$ and $V_z$ are the voltages at the X and Z ports, respectively. $I_Y$ and $I_X$ are the input current to the Y port and output current at the X port, respectively. The term "plus type VCII (VCII+)" is defined as a second-generation voltage-mode conveyor (VCII) in which current in the X terminal flows in the same direction with respect to that related to the Y terminal. The VCII+ has +β.

The term "negative type VCII (VCII−)" is defined as a second-generation voltage-mode conveyor (VCII) in which current in the X terminal flows in the opposite direction with respect to that related to the Y terminal. The VCII− has −β.

The term "impedance simulator" is defined as a circuit that allows simulation of input impedances that are inductive, capacitive and active (resistance). The impedance simulator is used for simulating the impedance of an electronic equipment under different power consumption platforms.

The term "active inductor" is defined as an inductorless circuit whose impedance rises with frequency across some frequency range. Occupying much less area than a passive inductor and offering tunability, the active inductor is useful in broadening the bandwidth or realizing other functions that require an inductive element.

The term "capacitance multiplier" is defined as an electronic circuit that increases the value of a reference capacitor by a certain multiplication factor, thus, achieving a higher equivalent capacitance level in an IC form. Capacitor multipliers are of particular importance for making integrated circuits possible that otherwise would be impractical with actual capacitors.

The term "impedance-multiplier" is defined as a circuit that effectively magnifies the impedance presented by an external load. An example of impedance-multiplier is an "impedance doubler", which doubles the effective impedance of the external load. The impedance multiplier circuit includes an input impedance having a defined value of impedance and a circuit coupled to this input impedance for multiplying its value by a multiplication factor.

Figure 1B:
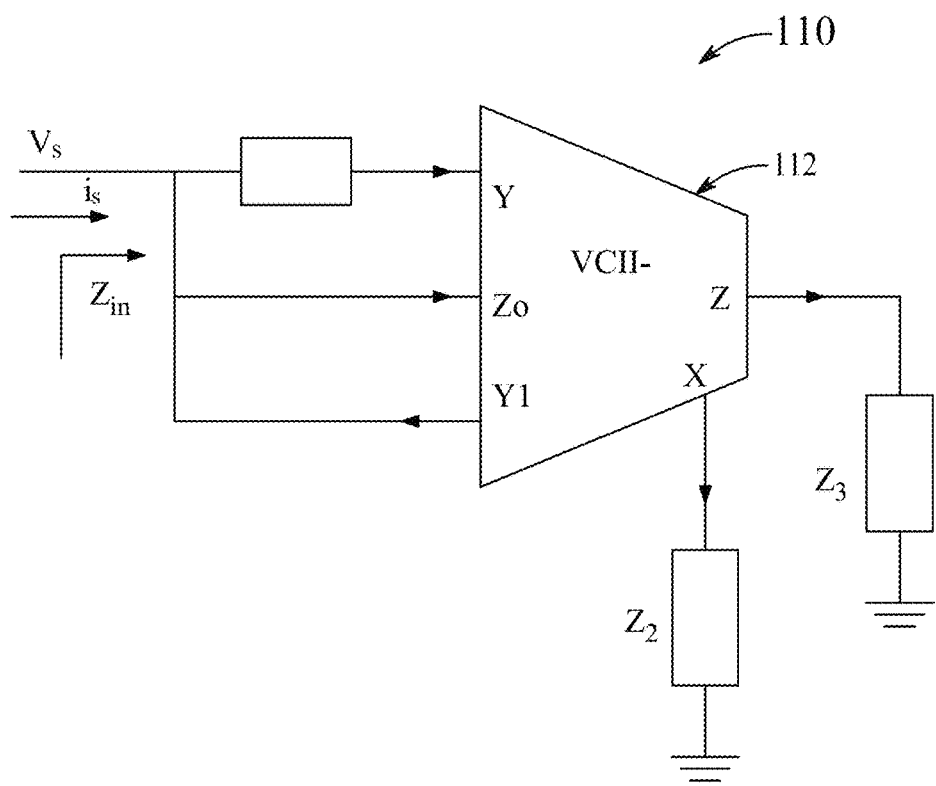
FIG. 1B illustrates a circuit diagram depicting an exemplary configuration of the tunable positive impedance simulator and impedance multiplier circuit, according to aspects of the present disclosure.
Figure 1C:
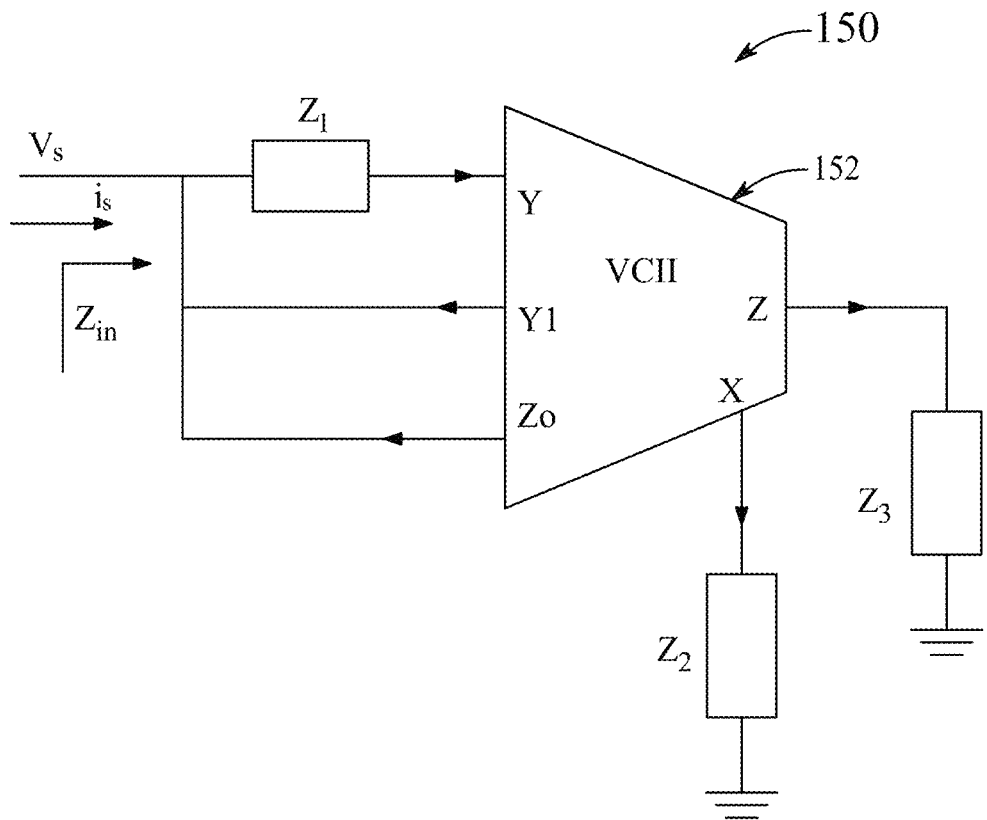
FIG. 1C illustrates another circuit diagram depicting an exemplary configuration of a tunable negative active inductor, capacitance and resistance simulator circuit, according to aspects of the present disclosure.

FIG. 1A-FIG. 1C illustrate an overall configuration of a tunable impedance simulator and impedance multiplier circuit.

FIG. 1A illustrates a high-level diagram illustrating an exemplary configuration of the tunable impedance simulator and impedance multiplier circuit 100 (hereinafter referred to as "the circuit 100"). Referring to FIG. 1A, the circuit 100 includes one second generation voltage-mode conveyor circuit (VCII) 102, a voltage source $V_s$, and three passive elements: a first impedance $Z_1$, a second impedance $Z_2$, and a third impedance $Z_3$.

The VCII 102 includes a positive input terminal Y, an impedance input terminal $Z_0$, a negative input terminal $Y_1$, an impedance output terminal Z, and a signal output terminal X. The VCII 102 is configured to be tuned by selecting values for $Z_1$, $Z_2$, and $Z_3$. In an aspect, the VCII 102 has a current gain β, and a voltage gain α. The positive input terminal Y is connected to a voltage source. The negative input terminal $Y_1$ is connected to the voltage source and the impedance input terminal $Z_0$. For example, the impedance input terminal $Z_0$ can be either positive or negative, such that the positive active inductor simulator, positive capacitance multiplier and positive resistance multiplier is implemented when the impedance input terminal $Z_0$ is positive, and a negative active inductor simulator, negative capacitance simulator, and negative resistance simulator can be implemented when the impedance input terminal $Z_0$ is negative. The impedance input terminal $Z_0$ can be configured as selectable by connecting a switchable inverter to the impedance input terminal $Z_0$.

In a connecting configuration, the first impedance $Z_1$ is connected to the positive input terminal Y. The voltage source $V_s$ is connected to the first impedance $Z_1$, the impedance input terminal $Z_0$, and the negative input terminal $Y_1$. The voltage source $V_s$, is configured to provide a voltage signal having an amplitude $|V_s|$ at a frequency, s.

The impedance input terminal $Z_0$ is configured to be selectable between a positive input impedance terminal and a negative input impedance terminal. In an aspect, the circuit 100 is configured to operate in two modes based upon the selection of the polarity of the impedance terminal $Z_0$. For example, when the impedance terminal $Z_0$ is positive, the circuit 100 is configured to operate as a tunable positive impedance simulator and impedance multiplier circuit 110, as shown in FIG. 1B. When the impedance terminal $Z_0$ is negative, the circuit 100 is configured to operate as a tunable negative active inductor, capacitor and resistance simulator circuit 150, as shown in FIG. 1C.

In an aspect, the circuit 100 is configured to operate as a tunable active inductor simulator (AIS). The tunable AIS is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$. A value of the inductor L is tuned by a selection of a value of $C_2$, a value of $R_1$ and a value of $R_3$.

In an aspect, the circuit 100 is configured to operate as a tunable capacitance multiplier is configured by setting $Z_1=1/sC_1$, $R_1=0$, $Z_2=R_2$, $C_2=0$, and $Z_3=R_3$. In the tunable capacitance multiplier, the input impedance is given by $$Z_{in} = \frac{1}{sC_1 \frac{R_2}{R_3}},$$

where the capacitance $C_1$, is multiplied by $R_2/R_3$. In an aspect, an amount of multiplication of $C_1$ is tuned based on a selection of a value of $R_2$ and a value of $R_3$.

In an aspect, the circuit 100 is configured to operate as a tunable resistance multiplier is configured by setting $Z_1=R_1$, $C_1=0$, $Z_2=R_2$, $C_2=0$, and $Z_3=R_3$. The input impedance of the tunable resistance multiplier is given by $$Z_{in} = R_1 \frac{R_3}{R_2},$$

where $R_1$ is multiplied by $R_3/R_2$. In an aspect, an amount of multiplication of $R_1$ is tuned based on a selection of a value of $R_2$ and a value of $R_3$.

In an aspect, the circuit 100 is configured to operate as a tunable negative AIS is configured by setting $Z_1=R_1$, $C_1=0$, $R_2=0$, $Z_2=1/sC_2$, and $Z_3=R_3$. The input impedance of the negative AIS is given by $Z_{in}=sC_2R_1R_3=sL$, where L represents an inductor given by $L=C_2R_1R_3$. In an aspect, a value of the inductor L is tuned based on a selection of a value of $C_2$, a value of $R_1$ and a value of $R_3$.

In an aspect, the circuit 100 is configured to operate as a tunable negative capacitance simulator by setting $Z_1=1/sC_1$, $R_1=0$, $Z_2=R_2$, $C_2=0$, and $Z_3=R_3$. The tunable negative capacitance simulator has an input impedance, given by $$Z_{in} = -\frac{1}{sC_1 \frac{R_2}{R_3}},$$

where the capacitance, $C_1$, is multiplied by $R_2/R_3$. In an aspect, an amount of multiplication of $C_1$ is tuned based on a selection of a value of $R_2$ and a value of $R_3$.

In an aspect, the circuit 100 is configured to operate as a tunable negative resistance simulator is configured by setting $Z_1=R_1$, $C_1=0$, $Z_2=R_2$, $C_2=0$, and $Z_3=R_3$. The input impedance of the tunable negative resistance simulator is given by $$Z_{in} = -R_1 \frac{R_3}{R_2},$$

where $R_1$ is multiplied by $R_3/R_2$. In an aspect, an amount of multiplication of $R_1$ is tuned by a selection of a value of $R_2$ and a value of $R_3$.

FIG. 1B illustrates a circuit diagram depicting an exemplary configuration of the tunable positive impedance simulator and impedance multiplier circuit 110 (hereinafter referred to as "circuit 110"). For example, the circuit 110 is a tunable active inductor simulator and capacitance multiplier and resistance multiplier. Referring to FIG. 1B, the circuit 110 includes a second generation voltage-mode conveyor circuit (VCII−) 112, a voltage source $V_s$, a first impedance $Z_1$, a second impedance $Z_2$, and a third impedance $Z_3$.

The construction of circuit 110 is substantially similar to that of the circuit 100, and thus the construction is not repeated here in detail for the sake of brevity. In an aspect, the impedance input terminal $Z_0$ of the circuit 110 is configured as a positive input impedance terminal $Z_0$. For example, an input impedance $Z_{in}$, to the VCII– 112 is given by $$Z_{in} = \frac{Z_1 Z_3}{Z_2}.$$

As shown in FIG. 1B, the input impedance $Z_{in}$ is given by:

$$Z_{in} = \frac{V_s}{i_s} = \frac{V_s}{i_y + i_{zo} - i_y} = \frac{V_s}{-i_z}. \quad (1)$$

$$i_z = \frac{V_z}{Z_3} = i_x Z_2/Z_3 = -i_y Z_2/Z_3. \quad (2)$$

As $i_y = V_s/Z_1$ the input impedance is given as:

$$Z_{in} = \frac{Z_1 Z_3}{Z_2}, \quad (3)$$

Using the equation (3), the circuit 110 is configured to implement as a positive AIS, the capacitance multiplier and the resistance multiplier as follows:

I. Implementation as the active inductor simulator (AIS)
With reference to equation (3), if $Z_1 = R_1$, $$Z_2 = \frac{1}{sC_2}$$

and $Z_3 = R_3$, the input impedance is given by:

$$Z_{in} = sC_2 R_1 R_3 = SL, \quad (4)$$

where $L = C_2 R_1 R_3$.

Equation (4) implements a tunable active inductor, and the value of the inductance is controlled using $R_1$, $R_3$ and $C_2$.

II. Implementation as the capacitance multiplier
If $$Z_1 = \frac{1}{sC_2},$$

$Z_2 = R_2$, and $Z_3 = R_3$, then the input impedance is given by:

$$Z_{in} = \frac{1}{sC_1 \frac{R_2}{R_3}}. \quad (5)$$

Equation (5) implements the capacitance multiplier in which the original capacitance $C_1$ is multiplied by $(R_2/R_3)$.

III. Implementation as the resistance multiplier
If $Z_1 = R_1$ (the resistance to be scaled up), $Z_2 = R_2$, and $Z_3 = R_3$ then the input impedance is given by:

$$Z_{in} = R_1 \frac{R_3}{R_2}. \quad (6)$$

From equation (6), $R_1$ is the resistance to be scaled using the ratio $$\frac{R_3}{R_2}.$$

FIG. 1C illustrates a circuit diagram depicting an exemplary configuration of a tunable negative AIS and capacitance simulator and resistance simulator circuit 150 (hereinafter referred to as "the circuit 150"). Referring to FIG. 1C, the circuit 150 includes a VCII 152, a voltage source $V_s$, the first impedance $Z_1$, the second impedance $Z_2$, and the third impedance $Z_3$. The construction of circuit 150 is substantially similar to that of the circuit 100, and thus the xconstruction is not repeated here in detail for the sake of brevity. In an aspect, the impedance input terminal $Z_0$ of the circuit 150 is configured as a negative input impedance terminal $Z_0$.

With reference to FIG. 1C, the input impedance $Z_{in}$ of the VCII 152 is given by:

$$Z_{in} = -\frac{Z_1 Z_3}{Z_2}. \quad (7)$$

To implement the tunable negative AIS, the circuit diagram of the circuit 150 as shown in FIG. 1C is used with $i_{zo} = i_z$.

IV. Implementation as the negative AIS
If $Z_1 = R_1$, $$Z_2 = \frac{1}{sC_2}$$

and $Z_3 = R_3$, then the negative active inductor is obtained and is given by:

$$Z_{in} = sC_2 R_1 R_3. \quad (8)$$

V. Implementation as the negative capacitance simulator
If $$Z_1 = \frac{1}{sC_1},$$

$Z_2 = R_2$, and $Z_3 = R_3$ then the input impedance is given by:

$$Z_{in} = -\frac{1}{sC_1 \frac{R_2}{R_3}}. \quad (9)$$

Using the equation (9), the circuit 150 is configured to implement as a tunable negative capacitance simulator.

VI. Implementation as the negative resistance simulator
If $Z_1 = R_1$ (the resistance to be scaled up), $Z_2 = R_2$, and $Z_3 = R_3$ then the input impedance is given by:

$$Z_{in} = -R_1 \frac{R_3}{R_2}. \quad (10)$$

Figure 1D:
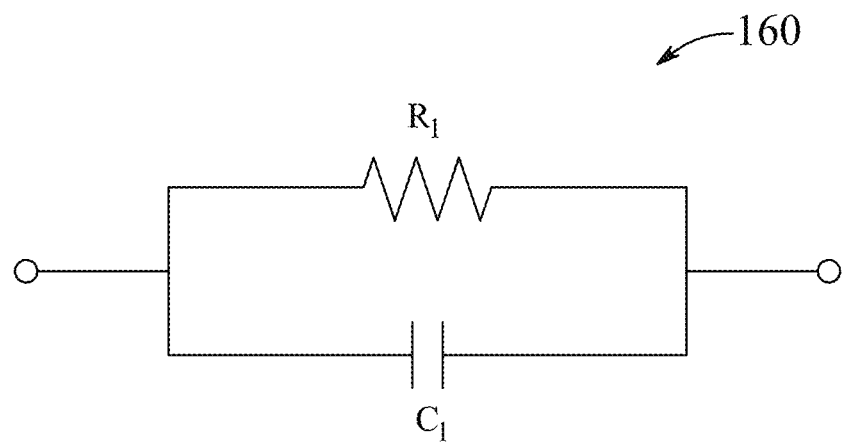
FIG. 1D illustrates a circuit diagram of depicting an internal circuit of a first impedance $Z_1$, according to aspects of the present disclosure.

FIG. 1D illustrates a circuit diagram depicting an internal circuit 160 of the first impedance $Z_1$. The internal circuit 160 of the first impedance $Z_1$ includes a resistor $R_1$, and a capacitor $C_1$ where the resistor $R_1$ is connected in parallel to the capacitor $C_1$.

Figure 1E:
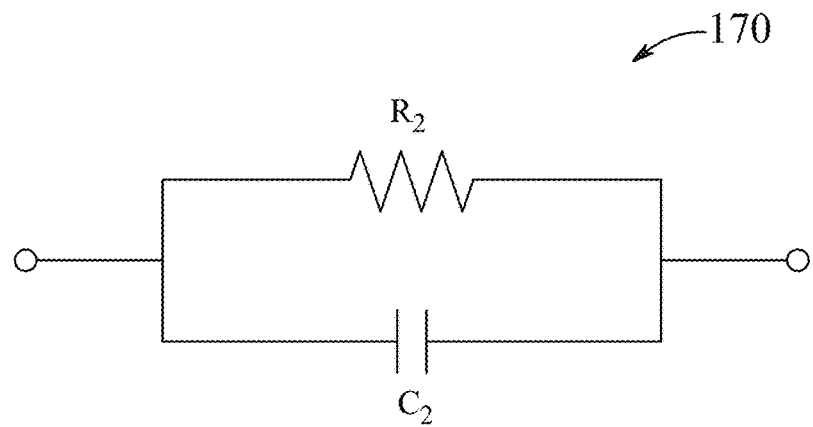
FIG. 1E illustrates a circuit diagram depicting an internal circuit of a second impedance $Z_2$, according to aspects of the present disclosure.
Figure 1F:
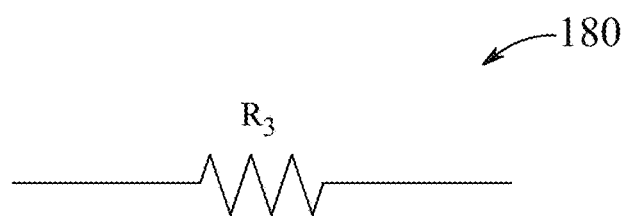
FIG. 1F illustrates a circuit diagram depicting an internal circuit of a third impedance $Z_3$, according to aspects of the present disclosure.

FIG. 1E illustrates a circuit diagram depicting an internal circuit 170 of the second impedance $Z_2$. The second impedance $Z_2$ has a first contactor and a second contactor. The first contactor is connected to the signal output terminal X. The second contactor is connected to the ground. The internal circuit 170 of the second impedance $Z_2$ includes a resistor $R_2$, and a capacitor $C_2$ where the resistor $R_2$ is connected in parallel to the capacitor $C_2$.

FIG. IF illustrates a circuit diagram depicting an internal circuit 180 of the third impedance $Z_3$. The third impedance $Z_3$ also has a first contactor and a second contactor. The first contactor is connected to the impedance output terminal Z. The second contactor is connected to the ground. The internal circuit 180 of the third impedance $Z_3$ includes a resistor $R_3$.

Figure 2A:
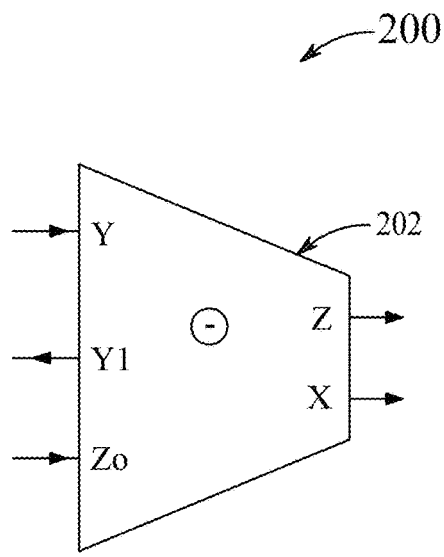
FIG. 2A illustrates a circuit diagram illustrating an exemplary configuration of a conventional second-generation voltage-mode conveyor (VCII)

FIG. 2A illustrates a conventional circuit diagram illustrating an exemplary configuration 200 of the VCII– 202.

The VCII– 202 includes a positive input terminal Y, an impedance input terminal $Z_0$, a negative input terminal $Y_1$, an impedance output terminal Z, and a signal output terminal X. The VCII– 202 has a current gain β, and a voltage gain α.

The conventional VCII– 202 has a low impedance current input port (Y), a high impedance current output port (X) and a low impedance voltage output port (Z). The impedance levels at the Y, X and Z ports are of significance in both voltage based and current based applications.

The relationship between voltages and currents terminals of the VCII– 202 are represented as:

$$\begin{bmatrix} i_{y1} \\ i_x \\ v_y \\ v_z \end{bmatrix} = \begin{bmatrix} -\beta & 0 \\ -\beta & 0 \\ 0 & 0 \\ 0 & \alpha \end{bmatrix} \begin{bmatrix} i_y \\ v_x \end{bmatrix}, i_{zo} = -i_z. \quad (11)$$

where β and α are current gain and voltage gain respectively of the VCII 202.

Figure 2B:
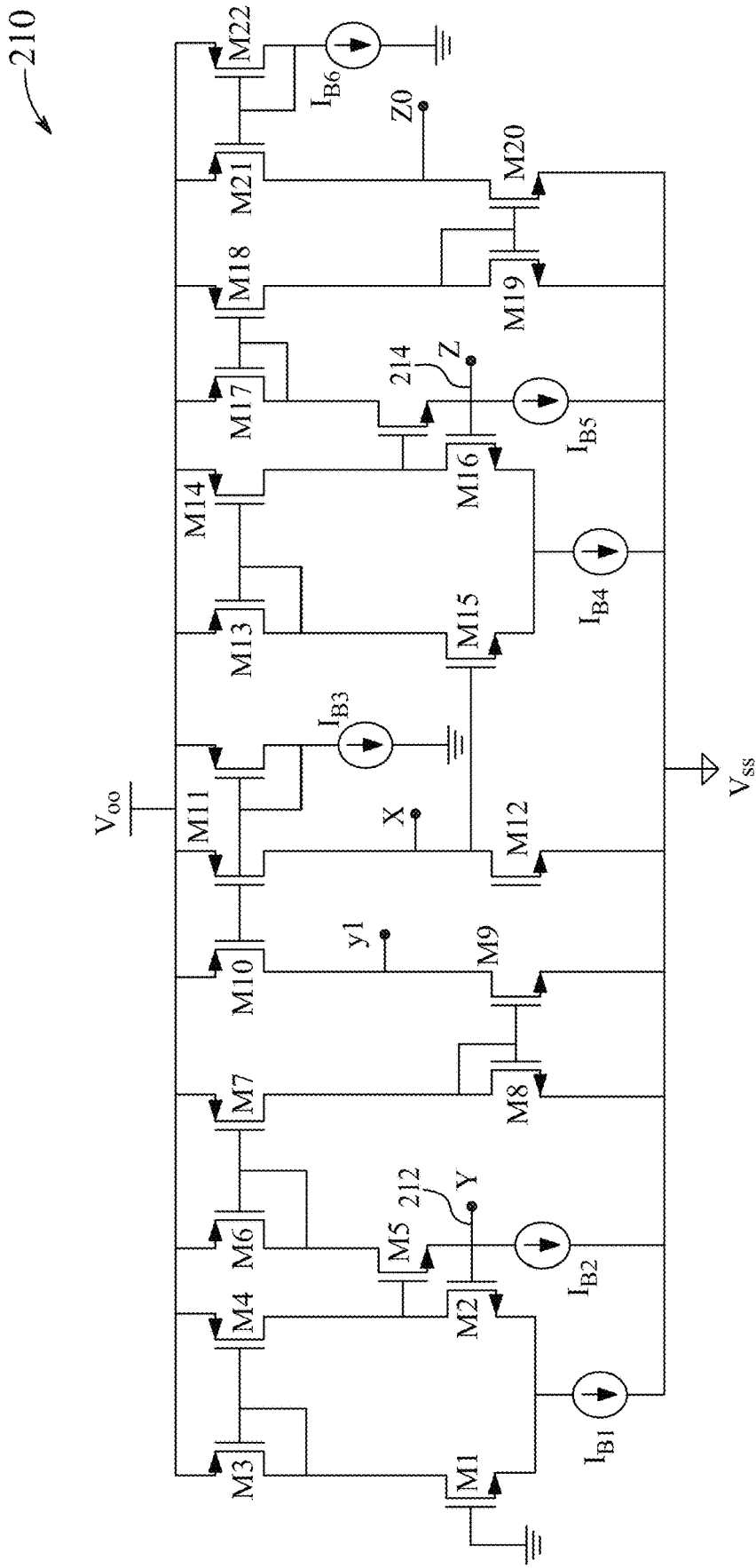
FIG. 2B illustrates an internal circuit diagram of the conventional VCII.

FIG. 2B illustrates a circuit diagram 210 of the conventional VCII– 202. As shown in FIG. 2B, the VCII– 202 includes a first differential amplifier 212 and a second differential amplifier 214. The first differential amplifier 212 has one input connected to the ground (Y terminal is virtually grounded). To achieve the current relations as shown in equation 11, several current mirrors are used. Current mirrors are used in the integrated circuits for biasing the amplifiers. The advantage of biasing the amplifiers with the current source is that it provides a high voltage gain and good biasing stability. The second differential amplifier 214 is configured as a buffer to yield $V_z=V_x$.

In an aspect, the VCII– 202 as shown in FIG. 2A and FIG. 2B is powered with a ±0.9V DC supply. In some examples, the aspect ratios for the NMOS (M1, M3, M5, M6, M9, M10, M12, M13, M15, M17, M20, M21) and PMOS transistors (M2, M4, M7, M8, M11, M14, M16, M18, M19, M22) are respectively chosen as 13.5 μm/0.54 μm and 40.5 μm/0.54 μm. The values of all the current sources are 25 μA. In an example, the current sources are designed using simple current mirrors. The terminal characteristics of the conventional VCII– 202 are shown in Table 1 given as below:

TABLE 1

The performance parameters of the VCII

| $R_Y, R_Z$ ($R_Y = R_1$) | $R_X, R_{Y1}, R_{zo}$ (kΩ) | $C_Z$ (femto farad) | $C_x$ (femto farad) | α | β | BW (MHz) |
|---|---|---|---|---|---|---|
| 47 Ω | 245 | 211 | 15 | 0.96 | 1.06 | 9 |

Examples and Experiments

The following examples are provided to illustrate further and to facilitate the understanding of the present disclosure.

Experimental Data and Analysis

First Experiment: Determining the functionality of the tunable positive impedance simulator and impedance multiplier circuit.

To confirm the functionality of the circuit 100, the AIS and the capacitor multiplier are used in the design of a high pass filter (HPF) and a low pass filter (LPF) respectively, while the resistance multiplier is used in the designing of the HPF.

Figure 3C:
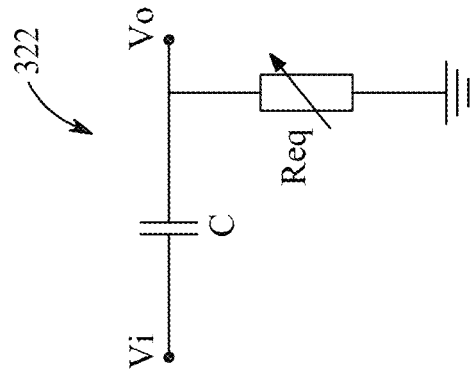
FIG. 3C illustrates a circuit diagram of the HPF designed using a resistance multiplier, according to aspects of the present disclosure.
Figure 3B:
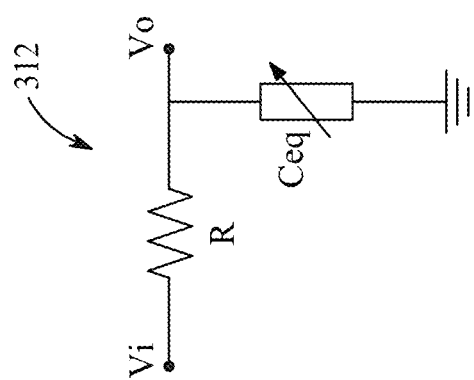
FIG. 3B illustrates a circuit diagram of a low pass filter (LPF) designed using a capacitance multiplier, according to aspects of the present disclosure.
Figure 3A:
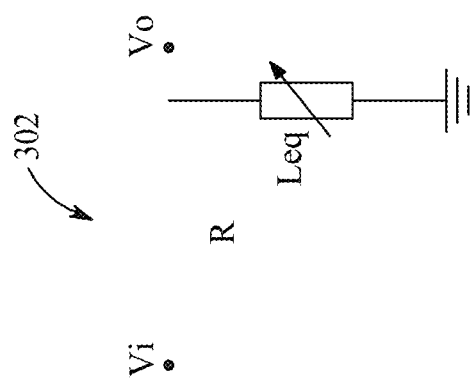
FIG. 3A illustrates a circuit diagram of a high pass filter (HPF) designed using an active inductor simulator, according to aspects of the present disclosure.

FIG. 3A illustrates a circuit diagram of a HPF 302 based on the AIS. An RL circuit acts as the HPF 302 as shown in FIG. 3A. In the circuit, the resistor R is a series component and an equivalent inductor $L_{eq}$ is a shunt component.

FIG. 3B illustrates a circuit diagram of a LPF 312 based on the capacitance multiplier. The resistor R is the series component and an equivalent capacitor $C_{eq}$ is the shunt component. For example, the capacitance multiplier is used in the design of the LPF 312 with R=10 kΩ, $C_1$=10 pF, $R_3$=10 kΩ and $R_2$ varies from 2 kΩ to 10 kΩ. The resistor R is placed in series with the power source and the equivalent capacitor $C_{eq}$ is placed in parallel to that same power source. A RC circuit as shown in FIG. 3B forms the LPF 312 because of the reactive properties of the equivalent capacitor $C_{eq}$. The equivalent capacitor $C_{eq}$ offers very high resistance or impedance to low frequency signals. Conversely, the equivalent capacitor $C_{eq}$ offers lower resistance as the frequency of the signal increases. Thus, the equivalent capacitor $C_{eq}$ offers very low impedance to a very high frequency signal. As the equivalent capacitor $C_{eq}$ offers low impedance to high-frequency signals, high frequency signals normally go through, as the capacitor equivalent $C_{eq}$ represent a low-impedance path. As it is known that the current always takes the path of least resistance. Thus, high-frequency signals pass via the capacitor path, while low-frequency signals do not take the capacitor path. Instead, the low-frequency signals are transmitted to output.

FIG. 3C illustrates a circuit diagram of the HPF 322 based on the resistance multiplier. Two passive elements equivalent resistor $R_{eq}$ and capacitor C are connected in series to allow passing of frequencies higher than the cut-off frequency of a signal. The output voltage is obtained across the equivalent resistor $R_{eq}$ by applying input voltage across the capacitor C. To scale a 100 Ω resistance to 50 kΩ, $R_1$=100 Ω (resistance to be scaled), $R_2$=10 Ω and $R_3$=5 Ω are used. The resistance multiplier is used in the design of the HPF with C=50 pF.

Figure 4:
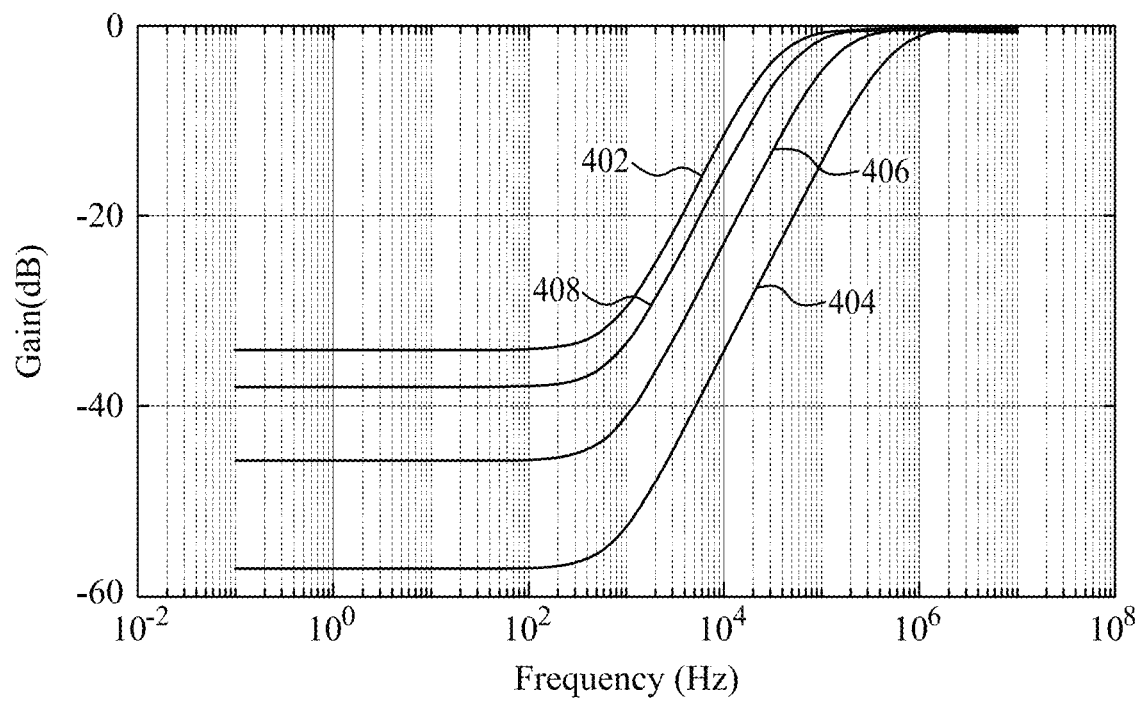
FIG. 4 is an exemplary illustration of a frequency response of the HPF designed using the active inductor simulator, according to aspects of the present disclosure.

FIG. 4 is an exemplary illustration of a frequency response of the HPF 302 designed using the AIS. During simulation, the value of resistance R was set to 1 kΩ. The active inductor (AI) parameters were: $R_1$=0.5 kΩ, $R_3$ was varied from 0.5 kΩ to 9.5 kΩ and $C_2$=1 nF. Curve 402 represents the frequency response of the HPF 302, when value of $R_3$ was 9.5 kΩ. Curve 404 represents the frequency response of the HPF 302, when value of $R_3$ was 0.5 kΩ. Curves 406 and 408 represent the intermediate frequency response of the HPF 302.

Figure 5:
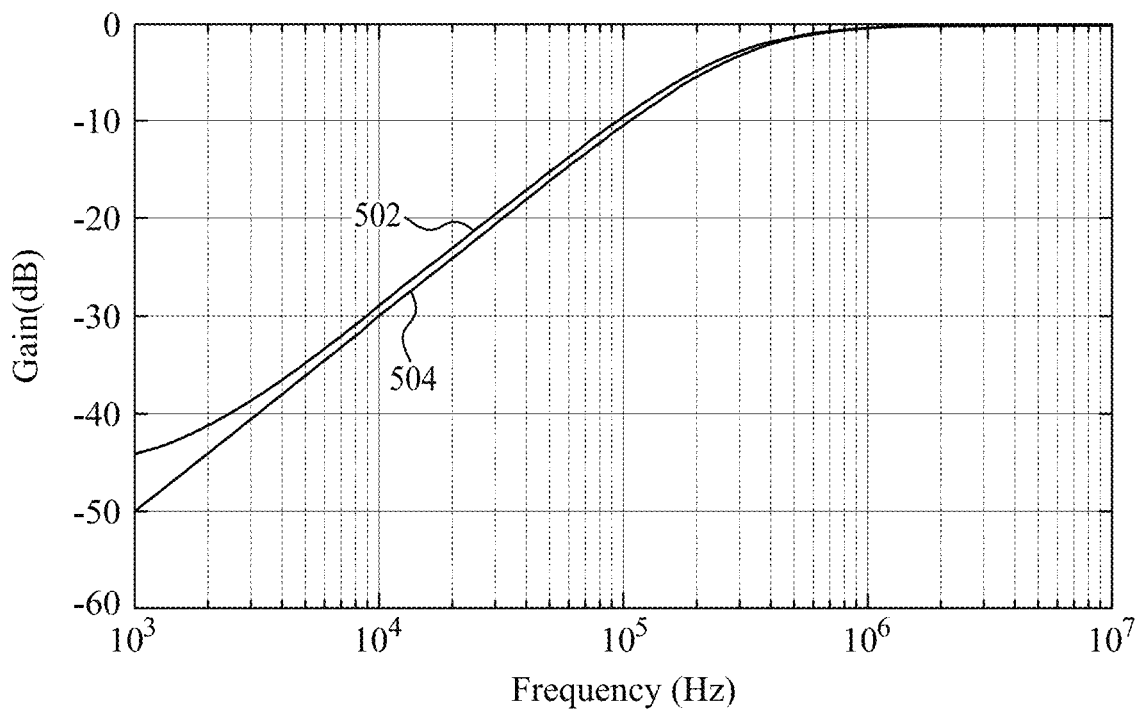
FIG. 5 is an exemplary illustration of an ideal inductance frequency response and a simulated inductance frequency response of the HPF, according to aspects of the present disclosure.

FIG. 5 is an exemplary illustration of an ideal inductance frequency response and a simulated inductance frequency response in the HPF 302. Curve 502 represents the simulated inductance frequency response of the HPF 302. Curve 504 represents the ideal inductance frequency response of the HPF 302. As shown in FIG. 4, the AIS follows the simulated curve 502 closely, and the −3 dB frequencies are close to the calculated values with a maximum error 1.6%. Ideal and simulated inductance frequency reposes in HPF 302 are shown in FIG. 5 for $L_{eq}$=0.5 mH. It can be observed from the plots that there is a small deviation, due to parasitic effects on the low frequency side.

Figure 6:
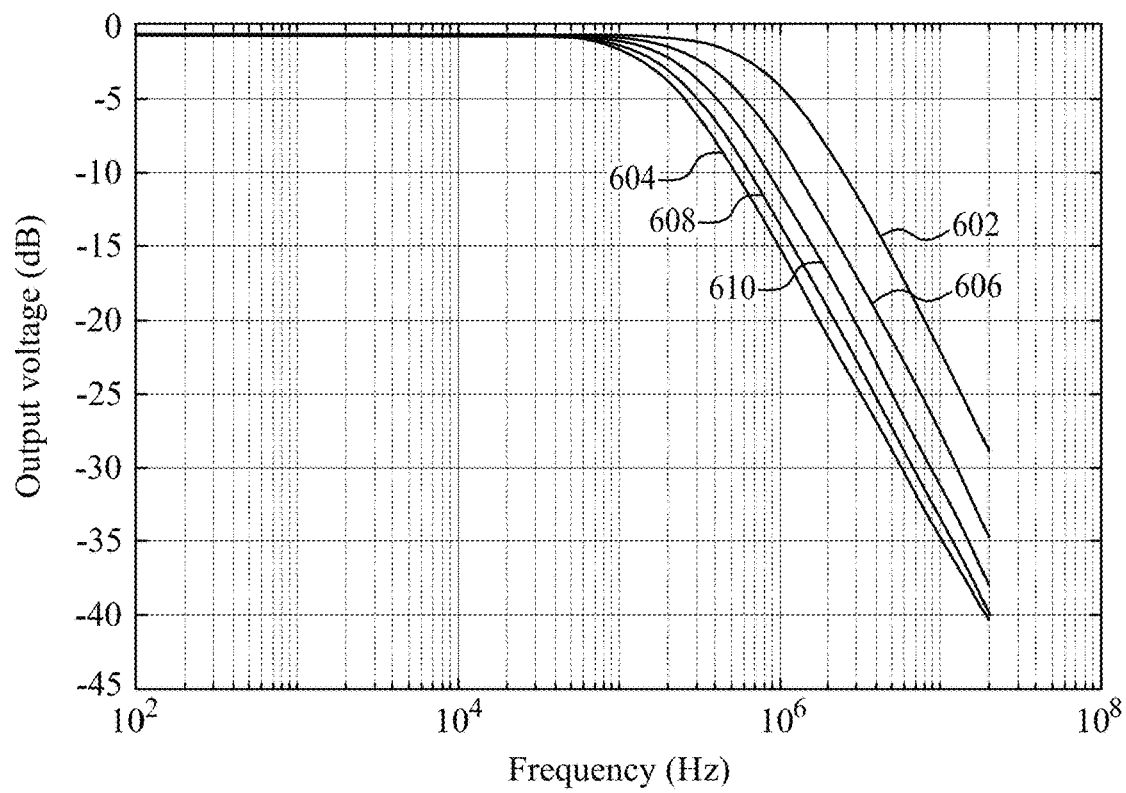
FIG. 6 is an exemplary illustration of the frequency response of the LPF designed using the capacitance multiplier, according to aspects of the present disclosure.

FIG. 6 is an exemplary illustration of the frequency response of the LPF 312 designed using the capacitance multiplier, according to aspects of the present disclosure. A curve 602 illustrates a frequency response of the LPF 312 of FIG. 3B, when the value of $R_2$ was chosen 2 K. A curve 604 illustrates a frequency response of the LPF 312, when the value of $R_2$ was chosen 10 K. Curves 606, 608, and 610 represent the intermediate frequency response of the LPF 312.

Figure 7:
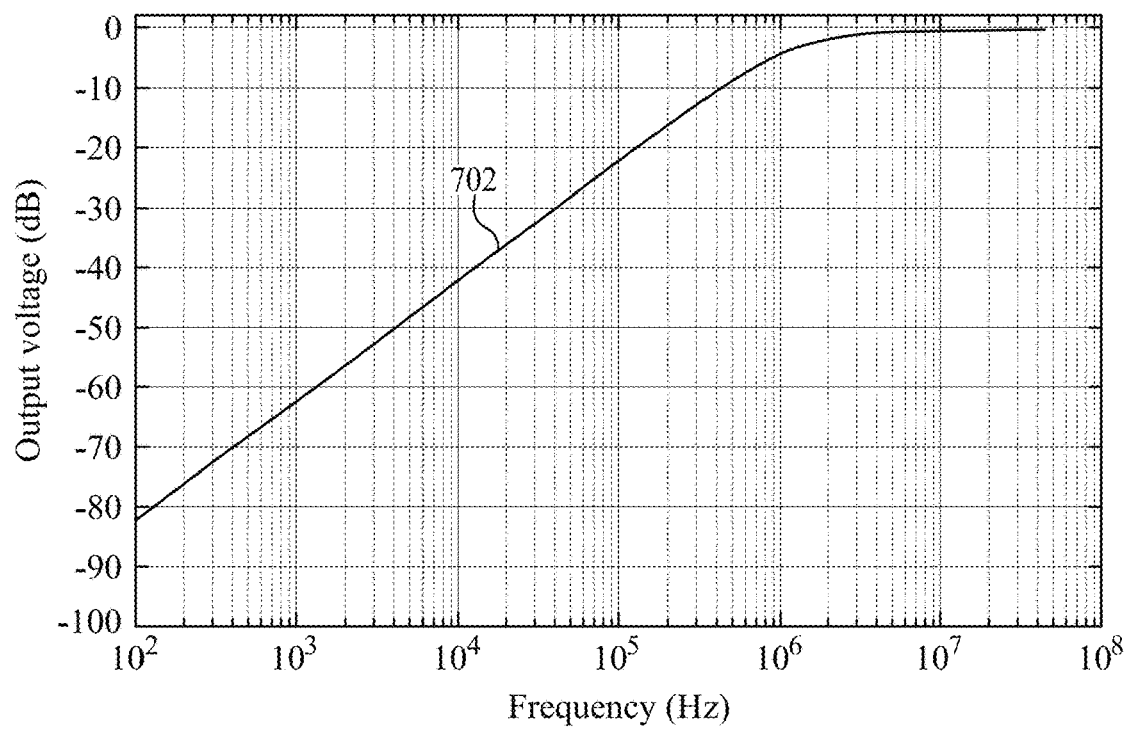
FIG. 7 is an exemplary illustration of the frequency response of the HPF designed using the resistance multiplier, according to aspects of the present disclosure.

FIG. 7 is an exemplary illustration of the frequency response of the HPF 322 designed using the resistance multiplier, according to aspects of the present disclosure. To scale a 100 Ω resistance to 50 kΩ, $R_1$=100 Ω (resistance to be scaled), $R_2$=10 Ω and $R_3$=5 kΩ was used. The resistance multiplier was used in the design of a high pass filter with C=50 pF. A curve 702 illustrates the frequency response of the HPF 322.

Second Experiment: Determining the functionality of the tunable negative active inductor, capacitor and resistance simulator circuit 150.

Figure 8A:
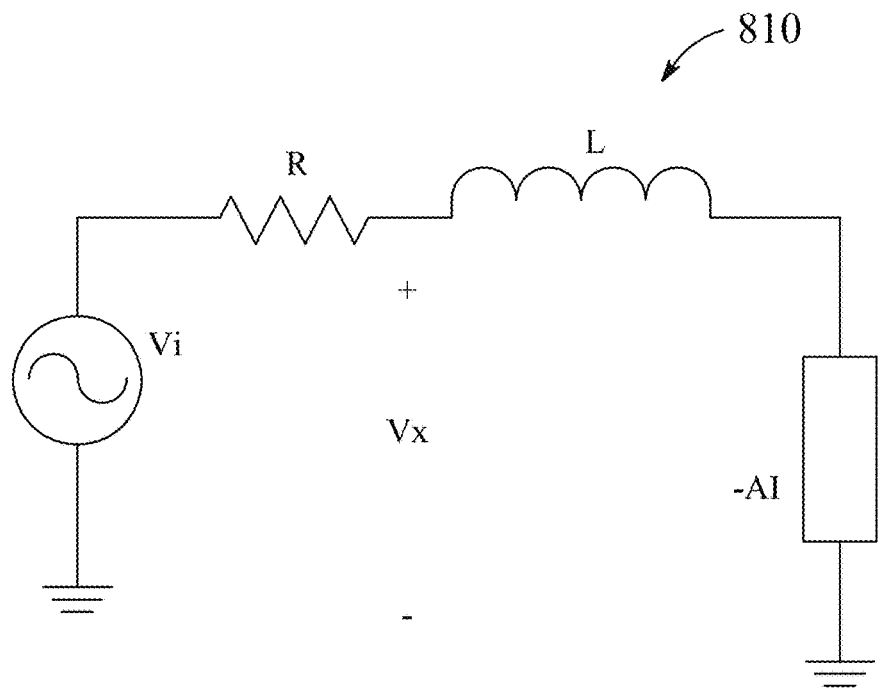
FIG. 8A illustrates a circuit used for transient analysis of a negative active inductor, according to aspects of the present disclosure.

To confirm the functionality of the tunable negative impedance simulator circuit 150, the realized components (negative active inductor, and capacitor simulator) were used in different applications as follows:

FIG. 8A illustrates a circuit 810 used for transient analysis of a negative AIS, according to aspects of the present disclosure. As known, the transient analysis calculates a circuit's response over a period of time defined by a user. When modeling a circuit, transient analysis is an important part of the analysis. The transient analysis for the circuit as shown in FIG. 8A was used to confirm the functionality of the negative AIS. The parameters used in FIG. 8A were AI=−2.5 µH, L=2.5 µH, and R=1 kΩ.

Figure 8B:
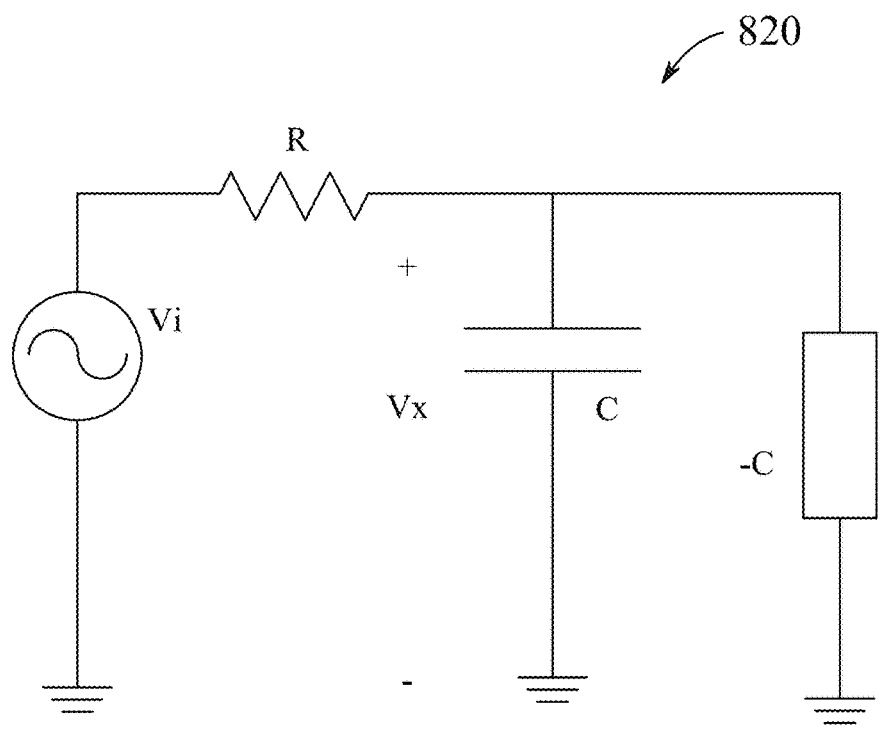
FIG. 8B illustrates another exemplary circuit used for transient analysis of the capacitance simulator, according to aspects of the present disclosure.

FIG. 8B illustrates another exemplary circuit 820 used for transient analysis of the capacitor simulator, according to aspects of the present disclosure. The transient analysis for the circuit shown in FIG. 8B was used for confirming the functionality of the capacitor simulator. The parameters used for FIG. 8B were capacitance C=−100 pF to compensate for 100 pF and R=100 Ω.

Figure 9A:
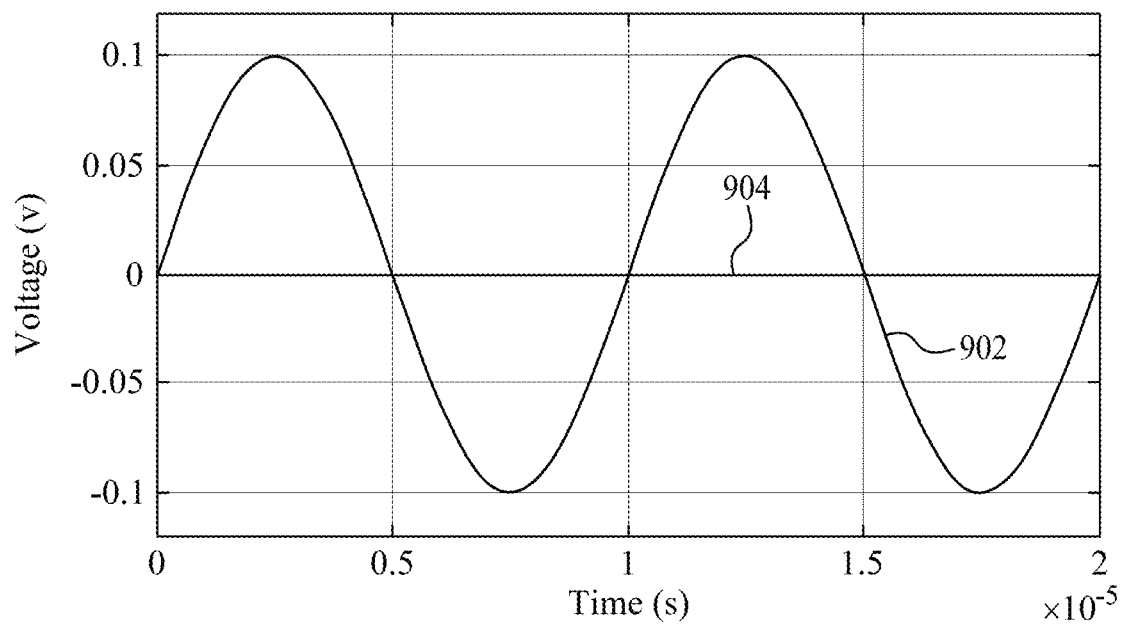
FIG. 9A is an exemplary illustration of a transient response, according to aspects of the present disclosure.

FIG. 9A is an exemplary illustration of the transient response, according to aspects of the present disclosure. As known, after an external excitation is applied, the transient response is a response of a circuit that fades out with time. The transient response is followed by a steady state response, which is the behavior of the circuit for a long time. A curve 902 indicates an input voltage $V_i$ and a curve 904 indicates a voltage $V_x$.

Figure 9B:
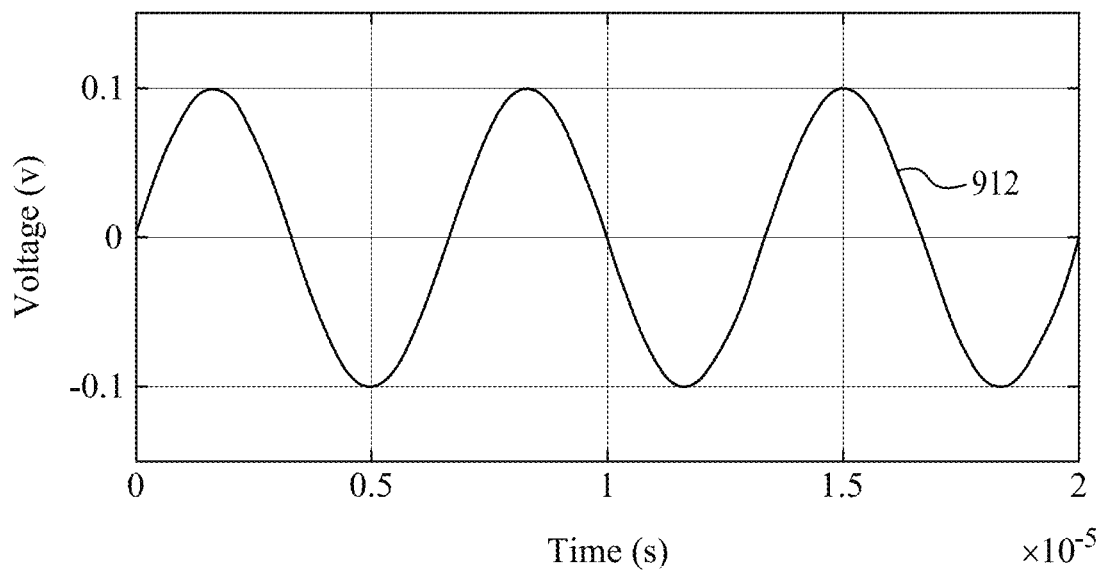
FIG. 9B is another exemplary illustration of the transient response, according to aspects of the present disclosure.

FIG. 9B is another exemplary illustration of the transient response, according to aspects of the present disclosure. A curve 912 indicates the input voltage $V_i$. It is observed from the FIG. 9A and FIG. 9B that the negative impedances canceled the effect of the positive impedances. For example, the total impedance is zero for the circuit 810 shown in FIG. 8a resulting in a short circuit and forcing $V_x$ to be zero and open circuit for the circuit 820 shown in FIG. 8B making $V_x=V_i$.

Figure 10:
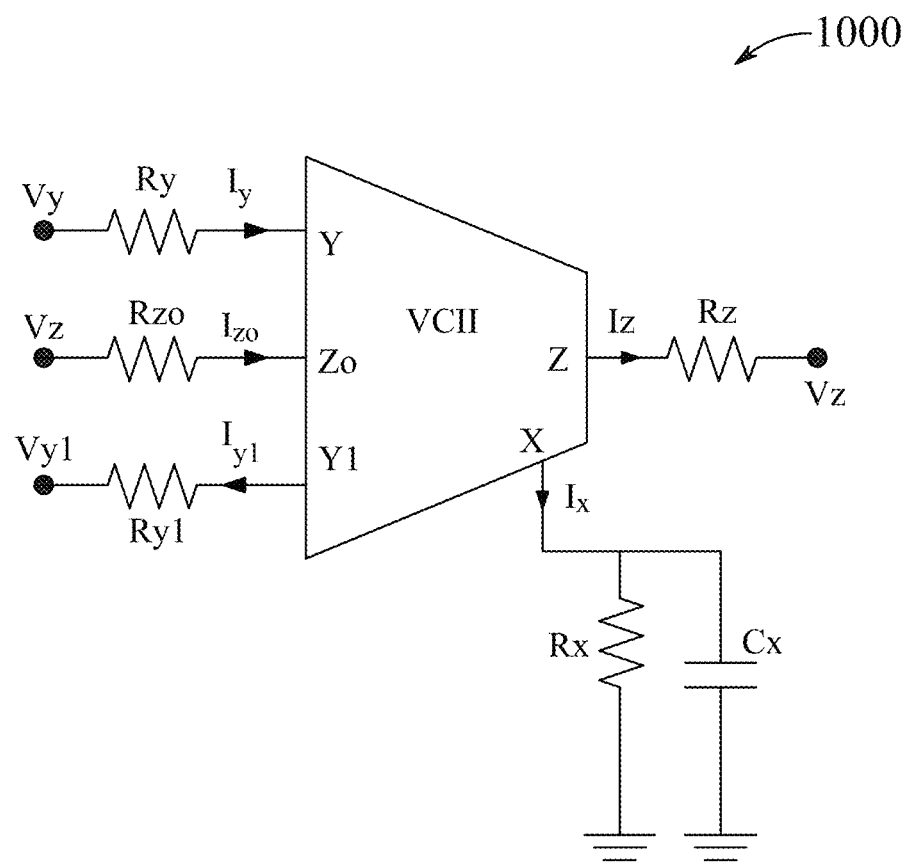
FIG. 10 illustrates a circuit diagram depicting an exemplary configuration of the VCII circuit with a parasitic capacitance, according to aspects of the present disclosure.

FIG. 10 illustrates a circuit diagram depicting an exemplary configuration of the VCII circuit 1000 with a parasitic capacitance, according to aspects of the present disclosure. FIG. 10 represents a non-ideal model for VCII 1000. The parameter values associated with the non-ideal model are the same as given in table 1. As an example, for the active inductor, the combining effect of $C_x$ and $R_x$ contributes to an error.

The input impedance of the VCII circuit 1000 is given by:

$$Z_{in} = \frac{R_3(R_1 + R_y)}{R_x} + \frac{R_3(R_1 + R_y)}{R_x} \times sC_2 R_x. \quad (12)$$

If $R_3(R_1+R_y) \ll R_x$, and if $R_1 \gg R_y$, equation 12 may be written as:

$Z_{in} = sC_2 R_3 R_1$, which is the same as equation 5.

The performance of the present circuit 100 is compared with the existing circuits and is summarized in Table 2. It is observed from the comparison table that the present circuit 100 is efficient in comparison to all existing circuits.

TABLE 2

Summary of performance comparison

| Circuits used: | No. of active building block (ABB) | No. of Floating (Grounded) elements | Supply Voltage (v) | Technology | Power consumption (W) | Frequency range (Hz) | Impedance/s simulated |
|---|---|---|---|---|---|---|---|
| Conventional grounded generalized impedance converter based on differential voltage current conveyor (DVCC) | 2 VDCC | 0(3) | NA | 0.18 | NA | 10 KkHz-10 MHz | Grounded inductor |

TABLE 2-continued

Summary of performance comparison

| Circuits used: | No. of active building block (ABB) | No. of Floating (Grounded) elements | Supply Voltage (v) | Technology | Power consumption (W) | Frequency range (Hz) | Impedance/s simulated |
|---|---|---|---|---|---|---|---|
| Conventional novel lossless and lossy grounded inductor simulators consisting of a canonical number of components | 1 CFOA | 2(1) | ±15 | NA | NA | NA | Grounded inductor |
| Conventional electronically tunable grounded/floating inductance simulators using Z-copy CFCCC | 1 ZC-CFCC | — | ±2.5 | 0.18 | 2.47 mW | NA | Grounded inductor |
| A conventional VCII based simulated grounded inductor | 2 VCII | 2(1) | ±0.9 | 0.18 | 0.65 mW | 10 KkHz-10 MHz | Grounded inductor |
| A conventional new simulated grounded inductor based on two NICs, two resistors and a grounded capacitor | 1 INIC 1 VNIC | 2(1) | ±0.75 | 0.13 | 532 mW | 50 kHz-50 MHz | Grounded inductor |
| A conventional new simulated inductor with reduced series resistor using a single VCII± | 1 VCII± | 2(1) | ±0.9 | 0.18 | 1.9 mW | 1 kHZ-10 MHz | Grounded inductor |
| The present circuit 100 | 1 VCII | 1(2) | ±0.9 | 0.18 | 17.6 µW | 10 kHz-10 MHz For C = 0.1 nF | Positive and Negative active inductor simulator, Negative capacitance simulator, Negative resistance simulator, Capacitance Multiplier, Resistance Multiplier |

The present disclosure describes a VCII based tunable positive and negative impedance simulator and impedance multiplier circuit 100. The functionality of the VCII based tunable positive and negative impedance simulator and impedance multiplier circuit 100 was verified using various filters and compensation applications. The design of the VCII based tunable positive and negative impedance simulator and impedance multiplier circuit 100 is compact and suitable for many integrated circuit applications in different frequency ranges.

The present circuit 100 employs one VCII and three passive elements. In an aspect, the functionality of the present circuit 100 is verified using Tanner T-spice in 0.18 µm Taiwan Semiconductor Manufacturing Company (TSMC) CMOS technology. In an example, the 0.18 µm CMOS technology is offered with a robust design kit that supports RF, analog, mixed-signal and digital design flows, plus various tutorials that use this technology for the design example.

The first embodiment is illustrated with respect to FIGS. 1-3. The first embodiment describes a tunable impedance simulator and impedance multiplier circuit 100. The circuit 100 includes one second generation voltage-mode conveyor circuit (VCII) 102 configured with a positive input terminal, Y, an impedance input terminal, $Z_0$, a negative input terminal, an impedance output terminal, Z, and a signal output terminal, X, wherein the impedance input terminal, $Z_0$, is configured to be selectable between a positive input impedance terminal and a negative input impedance terminal, where the VCII 102 has a current gain, β, and a voltage gain α, a first impedance, $Z_1$, connected to the positive input terminal, Y, a voltage source, $V_s$, connected to the first impedance, $Z_1$, the impedance input terminal, $Z_0$, and the negative input terminal, a second impedance, $Z_2$, having a first contactor connected to the signal output terminal, X and a second contactor connected to a ground, and a third impedance, $Z_3$, having a first contactor connected to the impedance output terminal, Z, and a second contactor connected to the ground, wherein the VCII 102 is configured to be tunable by selecting values for $Z_1$, $Z_2$, and $Z_3$.

In an aspect, an internal circuit of the first impedance, $Z_1$, comprises a resistor, $R_1$, in parallel with a capacitor, $C_1$; an internal circuit of the second impedance, $Z_2$, comprises a resistor, $R_2$, in parallel with a capacitor, $C_2$; an internal circuit of the third impedance, $Z_3$, consists of a resistor, $R_3$; and the voltage source, $V_s$, is configured to generate a voltage signal having an amplitude $|V_s|$ at a frequency, s.

The impedance input terminal, $Z_0$, is configured as a positive input impedance terminal; and an input impedance, $Z_{in}$, to the VCII 102 is given by $$Z_{in} = \frac{Z_1 Z_3}{Z_2}.$$

In an aspect, a tunable active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

In an aspect, a tunable capacitance multiplier is configured by setting $Z_1=1/sC_1$, $R_1=0$, $Z_2=R_2$, $C_2=0$, and $Z_3=R_3$, such that the input impedance is given by $$Z_{in} = \frac{1}{sC_1\frac{R_2}{R_3}},$$

where the capacitance, $C_1$, is multiplied by $R_2/R_3$, and an amount of multiplication of $C_1$ is tuned by a selection of a value of $R_2$ and a value of $R_3$.

In an aspect, a tunable resistance multiplier is configured by setting $Z_1=R_1$, $C_1=0$, $Z_2=R_2$, $C_2=0$, and $Z_3=R_3$, such that the input impedance is given by $$Z_{in} = R_1\frac{R_3}{R_2},$$

where $R_1$ is multiplied by $R_3/R_2$, and an amount of multiplication of $R_1$ is tuned by a selection of a value of $R_2$ and a value of $R_3$.

The impedance input terminal, $Z_0$, is a negative input impedance terminal and an input impedance, $Z_{in}$, to the VCII 102 is given by $$Z_{in} = -\frac{Z_1 Z_3}{Z_2}.$$

In an aspect, a tunable negative active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

In an aspect, a tunable negative capacitance simulator configured by setting $Z_1=1/sC_1$, $R_1=0$, $Z_2=R_2$, $C_2=0$, and $Z_3=R_3$, such that the input impedance is given by $$Z_{in} = -\frac{1}{sC_1\frac{R_2}{R_3}},$$

where the capacitance, $C_1$, is multiplied by $R_2/R_3$, and an amount of multiplication of $C_1$ is tuned by a selection of a value of $R_2$ and a value of $R_3$.

In an aspect, a tunable negative resistance simulator is configured by setting $Z_1=R_1$, $C_1=0$, $Z_2=R_2$, $C_2=0$, and $Z_3=R_3$, such that the input impedance is given by $$Z_{in} = -R_1\frac{R_3}{R_2},$$

where $R_1$ is multiplied by $R_3/R_2$, and an amount of multiplication of $R_1$ is tuned by a selection of a value of $R_2$ and a value of $R_3$.

The second embodiment is illustrated with respect to FIGS. 1-3. The second embodiment describes a method for implementing a tunable impedance simulator and impedance multiplier circuit 100. The method includes selecting one second generation voltage-mode conveyor circuit (VCII) 102 configured with a positive input terminal, Y, an impedance input terminal, $Z_0$, a negative input terminal, an impedance output terminal, Z, and a signal output terminal, X, wherein the impedance input terminal, $Z_0$, is configured to be selectable between a positive input impedance terminal and a negative input impedance terminal, and wherein the VCII 102 has a current gain, β, and a voltage gain α, connecting a first impedance, $Z_1$, to the positive input terminal, Y, wherein an internal circuit of the first impedance, $Z_1$, comprises a resistor, $R_1$, in parallel with a capacitor, $C_1$, connecting a voltage source, $V_s$, to the first impedance, $Z_1$, the impedance input terminal, $Z_0$, and the negative input terminal, connecting a first contactor of a second impedance, $Z_2$, to the signal output terminal, X and a second contactor of the second impedance to a ground, wherein an internal circuit of the second impedance, $Z_2$, comprises a resistor, $R_2$, in parallel with a capacitor, $C_2$, connecting a first contactor of a third impedance, $Z_3$, to the impedance output terminal, Z, and a second contactor of the third impedance to the ground, wherein an internal circuit of the third impedance, $Z_3$, consists of a resistor, $R_3$, generating, with the voltage source, $V_s$, a voltage signal having an amplitude $|V_s|$ at a frequency, s, and tuning the VCII 102 by selecting values for $R_1$, $C_1$, $R_2$, $C_2$, and $R_3$.

The method further includes selecting the impedance input terminal, $Z_0$, to be a positive input impedance terminal such that an input impedance, $Z_{in}$, to the VCII 102 is given by $$Z_{in} = \frac{Z_1 Z_3}{Z_2}.$$

The method further includes configuring a tunable active inductor simulator by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

The method further includes configuring a tunable capacitance multiplier by setting $Z_1=1/sC_1$, $R_1=0$, $Z_2=R_2$, $C_2=0$, and $Z_3=R_3$, such that the input impedance is given by $$Z_{in} = \frac{1}{sC_1 \frac{R_2}{R_3}},$$

where the capacitance, $C_1$, is multiplied by $R_2/R_3$, and an amount of multiplication of $C_1$ is tuned by a selection of a value of $R_2$ and a value of $R_3$.

The method further includes configuring a tunable resistance multiplier by setting $Z_1=R_1$, $C_1=0$, $Z_2=R_2$, $C_2=0$, and $Z_3=R_3$, such that the input impedance is given by $$Z_{in} = R_1 \frac{R_3}{R_2},$$

where $R_1$ is multiplied by $R_3/R_2$, and an amount of multiplication of $R_1$ is tuned by a selection of a value of $R_2$ and a value of $R_3$.

The method further includes selecting the impedance input terminal, $Z_O$, to be a negative input impedance terminal such that an input impedance, $Z_{in}$, to the VCII is given by $$Z_{in} = -\frac{Z_1 Z_3}{Z_2}.$$

The method further includes configuring a tunable negative active inductor simulator by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

The method further includes configuring a tunable negative capacitance simulator by setting $Z_1=1/sC_1$, $R_1=0$, $Z_2=R_2$, $C_2=0$, and $Z_3=R_3$, such that the input impedance is given by $$Z_{in} = -\frac{1}{sC_1 \frac{R_2}{R_3}},$$

where the capacitance, $C_1$, is multiplied by $R_2/R_3$, and an amount of multiplication of $C_1$ is tuned by a selection of a value of $R_2$ and a value of $R_3$.

The method further includes configuring a tunable negative resistance simulator by setting $Z_1=R_1$, $C_1=0$, $Z_2=R_2$, $C_2=0$, and $Z_3=R_3$, such that the input impedance is given by $$Z_{in} = -R_1 \frac{R_3}{R_2},$$

where $R_1$ is multiplied by $R_3/R_2$, and an amount of multiplication of $R_1$ is tuned by a selection of a value of $R_2$ and a value of $R_3$.

The third embodiment is illustrated with respect to FIGS. 1-3. The third embodiment describes a system for configuring a second generation voltage-mode conveyor circuit (VCII) as a tunable impedance simulator and impedance multiplier circuit 100. The system includes one second generation voltage-mode conveyor circuit (VCII) 102 including a positive input terminal, Y, an impedance input terminal, $Z_O$, a negative input terminal, an impedance output terminal, Z, and a signal output terminal, X, wherein the impedance input terminal, $Z_O$, is configured to be selectable between a positive input impedance terminal and a negative input impedance terminal, where the VCII 102 has a current gain, β, and a voltage gain, α; a first impedance, $Z_1$, connected to the positive input terminal, Y, wherein an internal circuit of the first impedance, $Z_1$, comprises a resistor, $R_1$, in parallel with a capacitor, $C_1$, a voltage source, $V_s$, connected to the first impedance, $Z_1$, the impedance input terminal, $Z_O$, and the negative input terminal, wherein the voltage source, V, is configured to generate a voltage signal having an amplitude $|V_s|$ at a frequency, s; a second impedance, $Z_2$, having a first contactor connected to the signal output terminal, X and a second contactor connected to a ground, wherein an internal circuit of the second impedance, $Z_2$, comprises a resistor, $R_2$, in parallel with a capacitor, $C_2$; a third impedance, $Z_3$, having a first contactor connected to the impedance output terminal, Z, and a second contactor connected to the ground, wherein an internal circuit of the third impedance, $Z_3$, consists of a resistor, $R_3$, and the VCII 102 is configured to be tunable by selecting values for $R_1$, $C_1$, $R_2$, $C_2$, and $R_3$, such that: when the impedance input terminal, $Z_O$, is configured to be a positive input impedance terminal, an input impedance, $Z_{in}$, to the VCII 102 is given by $$Z_{in} = \frac{Z_1 Z_3}{Z_2},$$

any one of: a tunable active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$, a tunable capacitance multiplier is configured by setting $Z_1=1/sC_1$, $R_1=0$, $Z_2=R_2$, $C_2=0$, and $Z_3=R_3$, such that the input impedance is given by $$Z_{in} = \frac{1}{sC_1 \frac{R_2}{R_3}},$$

where the capacitance, $C_1$, is multiplied by $R_2/R_3$, and an amount of multiplication of $C_1$ is tuned by a selection of a value of $R_2$ and a value of $R_3$, and a tunable resistance multiplier is configured by setting $Z_1=R_1$, $C_1=0$, $Z_2=R_2$, $C_2=0$, and $Z_3=R_3$, such that the input impedance is given by $$Z_{in} = R_1 \frac{R_3}{R_2},$$

where $R_1$ is multiplied by $R_3/R_2$, and an amount of multiplication of $R_1$ is tuned by a selection of a value of $R_2$ and a value of $R_3$; and when the impedance input terminal, $Z_O$, is configured to be a negative input impedance terminal, an input impedance, $Z_{in}$, to the VCII is given by $$Z_{in} = -\frac{Z_1 Z_3}{Z_2},$$

any one of: a tunable negative active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$, a tunable negative capacitance simulator is configured by setting $Z_1=1/sC_1$, $R_1=0$, $Z_2=R_2$, $C_2=0$, and $Z_3=R_3$, such that the input impedance is given by $$Z_{in} = -\frac{1}{sC_1\frac{R_2}{R_3}},$$

where the capacitance, $C_1$, is multiplied by $R_2/R_3$, and an amount of multiplication of $C_1$ is tuned by a selection of a value of $R_2$ and a value of $R_3$, and a tunable negative resistance simulator is configured by setting $Z_1=R_1$, $C_1=0$, $Z_2=R_2$, $C_2=0$, and $Z_3=R_3$, such that the input impedance is given by $$Z_{in} = -R_1\frac{R_3}{R_2},$$

where $R_1$ is multiplied by $R_3/R_2$, and an amount of multiplication of $R_1$ is tuned by a selection of a value of $R_2$ and a value of $R_3$.

Moreover, the present disclosure is not limited to the specific circuit elements described herein, nor is the present disclosure limited to the specific sizing and classification of these elements. For example, the skilled artisan will appreciate that the circuitry described herein may be adapted based on changes to resistors and capacitors in the circuits, and the addition of circuit elements, such as diodes.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A tunable impedance simulator and impedance multiplier circuit, comprising:
one second generation voltage-mode conveyor circuit (VCII) configured with a positive input terminal Y, an impedance input terminal $Z_0$, a negative input terminal, an impedance output terminal Z, and a signal output terminal X, wherein the impedance input terminal $Z_0$ is configured to be selectable between a positive input impedance terminal and a negative input impedance terminal, where the VCII has a current gain β and a voltage gain α;
a first impedance $Z_1$ connected to the positive input terminal Y;
a voltage source $V_s$ connected to the first impedance $Z_1$, the impedance input terminal, $Z_0$, and the negative input terminal;
a second impedance $Z_2$ having a first contactor connected to the signal output terminal X and a second contactor connected to a ground; and
a third impedance $Z_3$ having a first contactor connected to the impedance output terminal Z, and a second contactor connected to the ground, wherein the VCII is configured to be tunable by selecting values for $Z_1$, $Z_2$, and $Z_3$.

2. The tunable impedance simulator and impedance multiplier circuit of claim 1, wherein:
an internal circuit of the first impedance $Z_1$ comprises a resistor $R_1$ in parallel with a capacitor $C_1$;
an internal circuit of the second impedance $Z_2$ comprises a resistor $R_2$ in parallel with a capacitor $C_2$;
an internal circuit of the third impedance $Z_3$ consists of a resistor $R_3$; and
the voltage source $V_s$ is configured to generate a voltage signal having an amplitude $|V_s|$ at a frequency s.

3. The tunable impedance simulator and impedance multiplier circuit of claim 2, wherein:
the impedance input terminal $Z_0$ is configured as a positive input impedance terminal; and
an input impedance $Z_{in}$ to the VCII is given by $$Z_{in} = \frac{Z_1 Z_3}{Z_2}.$$

4. The tunable impedance simulator and impedance multiplier circuit of claim 3, wherein:
a tunable active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

5. The tunable impedance simulator and impedance multiplier circuit of claim 3, wherein:
a tunable capacitance multiplier is configured by setting $Z_1=1/sC_1$, $R_1=0$, $Z_2=R_2$, $C_2=0$, and $Z_3=R_3$, such that the input impedance is given by $$Z_{in} = \frac{1}{sC_1\frac{R_2}{R_3}},$$

where the capacitance, $C_1$, is multiplied by $R_2/R_3$, and an amount of multiplication of $C_1$ is tuned by a selection of a value of $R_2$ and a value of $R_3$.

6. The tunable impedance simulator and impedance multiplier circuit of claim 3, wherein:
a tunable resistance multiplier is configured by setting $Z_1=R_1$, $C_1=0$, $Z_2=R_2$, $C_2=0$, and $Z_3=R_3$, such that the input impedance is given by $$Z_{in} = R_1\frac{R_3}{R_2},$$

where $R_1$ is multiplied by $R_3/R_2$, and an amount of multiplication of $R_1$ is tuned by a selection of a value of $R_2$ and a value of $R_3$.

7. The tunable impedance simulator and impedance multiplier circuit of claim 1, wherein the impedance input terminal $Z_0$, is configured as a negative input impedance terminal and an input impedance $Z_{in}$, to the VCII is given by $$Z_{in} = -\frac{Z_1 Z_3}{Z_2}.$$

8. The tunable impedance simulator and impedance multiplier circuit of claim 7, wherein:
a tunable negative active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

9. The tunable impedance simulator and impedance multiplier circuit of claim 7, wherein:
a tunable negative capacitance simulator configured by setting $Z_1=1/sC_1$, $R_1=0$, $Z_2=R_2$, $C_2=0$, and $Z_3=R_3$, such that the input impedance is given by $$Z_{in} = -\frac{1}{sC_1\frac{R_2}{R_3}},$$

where the capacitance $C_1$ is multiplied by $R_2/R_3$, and an amount of multiplication of $C_1$ is tuned by a selection of a value of $R_2$ and a value of $R_3$.

10. The tunable impedance simulator and impedance multiplier circuit of claim 7, wherein:
a tunable negative resistance simulator is configured by setting $Z_1=R_1$, $C_1=0$, $Z_2=R_2$, $C_2=0$, and $Z_3=R_3$, such that the input impedance is given by $$Z_{in} = -R_1\frac{R_3}{R_2},$$

where $R_1$ is multiplied by $R_3/R_2$, and an amount of multiplication of $R_1$ is tuned by a selection of a value of $R_2$ and a value of $R_3$.

11. A method for implementing a tunable impedance simulator and impedance multiplier circuit, comprising:
selecting one second generation voltage-mode conveyor circuit (VCII) configured with a positive input terminal Y, an impedance input terminal $Z_0$, a negative input terminal, an impedance output terminal Z, and a signal output terminal X, wherein the impedance input terminal $Z_0$ is configured to be selectable between a positive input impedance terminal and a negative input impedance terminal, and wherein the VCII has a current gain β, and a voltage gain α;
connecting a first impedance $Z_1$ to the positive input terminal Y, wherein an internal circuit of the first impedance $Z_1$ comprises a resistor $R_1$ in parallel with a capacitor $C_1$;
connecting a voltage source $V_s$ to the first impedance, $Z_1$, the impedance input terminal $Z_0$, and the negative input terminal;
connecting a first contactor of a second impedance $Z_2$ to the signal output terminal X and a second contactor of the second impedance to a ground, wherein an internal circuit of the second impedance $Z_2$ comprises a resistor $R_2$ in parallel with a capacitor $C_2$;
connecting a first contactor of a third impedance $Z_3$ to the impedance output terminal Z, and a second contactor of the third impedance to the ground, wherein an internal circuit of the third impedance $Z_3$ consists of a resistor $R_3$;
generating, with the voltage source $V_s$, a voltage signal having an amplitude $|V_s|$ at a frequency s; and
tuning the VCII by selecting values for $R_1$, $C_1$, $R_2$, $C_2$, and $R_3$.

12. The method of claim 11, further comprising:
selecting the impedance input terminal $Z_0$ to be a positive input impedance terminal, such that an input impedance $Z_{in}$ to the VCII is given by $$Z_{in} = \frac{Z_1Z_3}{Z_2}.$$

13. The method of claim 12, further comprising:
configuring a tunable active inductor simulator by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

14. The method of claim 12, further comprising:
configuring a tunable capacitance multiplier by setting $Z_1=1/sC_1$, $R_1=0$, $Z_2=R_2$, $C_2=0$, and $Z_3=R_3$, such that the input impedance is given by $$Z_{in} = \frac{1}{sC_1\frac{R_2}{R_3}},$$

where the capacitance, $C_1$, is multiplied by $R_2/R_3$, and an amount of multiplication of $C_1$ is tuned by a selection of a value of $R_2$ and a value of $R_3$.

15. The method of claim 12, wherein:
configuring a tunable resistance multiplier by setting $Z_1=R_1$, $C_1=0$, $Z_2=R_2$, $C_2=0$, and $Z_3=R_3$, such that the input impedance is given by $$Z_{in} = R_1\frac{R_3}{R_2},$$

where $R_1$ is multiplied by $R_3/R_2$, and an amount of multiplication of $R_1$ is tuned by a selection of a value of $R_2$ and a value of $R_3$.

16. The method of claim 11, further comprising:
selecting the impedance input terminal $Z_0$ to be a negative input impedance terminal such that an input impedance $Z_{in}$ to the VCII is given by $$Z_{in} = -\frac{Z_1Z_3}{Z_2}.$$

17. The method circuit of claim 16, further comprising:
configuring a tunable negative active inductor simulator by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$.

18. The method of claim 16, further comprising:
configuring a tunable negative capacitance simulator by setting $Z_1=1/sC_1$, $R_1=0$, $Z_2=R_2$, $C_2=0$, and $Z_3=R_3$, such that the input impedance is given by $$Z_{in} = -\frac{1}{sC_1\frac{R_2}{R_3}},$$

where the capacitance $C_1$ is multiplied by $R_2/R_3$, and an amount of multiplication of $C_1$ is tuned by a selection of a value of $R_2$ and a value of $R_3$.

19. The method of claim 16, further comprising:
configuring a tunable negative resistance simulator by setting $Z_1=R_1$, $C_1=0$, $Z_2=R_2$, $C_2=0$, and $Z_3=R_3$, such that the input impedance is given by $$Z_{in} = -R_1\frac{R_3}{R_2},$$

where $R_1$ is multiplied by $R_3/R_2$, and an amount of multiplication of $R_1$ is tuned by a selection of a value of $R_2$ and a value of $R_3$.

20. A system for configuring a second generation voltage-mode conveyor circuit (VCII) as a tunable impedance simulator and impedance multiplier, comprising:
one second generation voltage-mode conveyor circuit (VCII) including a positive input terminal Y, an impedance input terminal $Z_0$, a negative input terminal, an impedance output terminal Z, and a signal output terminal X, wherein the impedance input terminal $Z_0$ is configured to be selectable between a positive input impedance terminal and a negative input impedance terminal, where the VCII has a current gain $\beta$ and a voltage gain $\alpha$;
a first impedance $Z_1$ connected to the positive input terminal Y, wherein an internal circuit of the first impedance $Z_1$ comprises a resistor $R_1$ in parallel with a capacitor $C_1$;
a voltage source $V_s$ connected to the first impedance $Z_1$, the impedance input terminal $Z_0$ and the negative input terminal wherein the voltage source V is configured to generate a voltage signal having an amplitude $|V_s|$ at a frequency s;
a second impedance $Z_2$ having a first contactor connected to the signal output terminal X and a second contactor connected to a ground, wherein an internal circuit of the second impedance $Z_2$ comprises a resistor $R_2$ in parallel with a capacitor $C_2$;
a third impedance $Z_3$ having a first contactor connected to the impedance output terminal Z, and a second contactor connected to the ground, wherein an internal circuit of the third impedance $Z_3$ consists of a resistor $R_3$; and
the VCII is configured to be tunable by selecting values for $R_1$, $C_1$, $R_2$, $C_2$, and $R_3$, such that:
when the impedance input terminal $Z_0$ is configured to be a positive input impedance terminal, an input impedance $Z_{in}$, to the VCII is given by $$Z_{in} = \frac{Z_1 Z_3}{Z_2},$$

any one of:
a tunable active inductor simulator is configured by setting $Z_1=R_1$, $C_1=0$, $R_2=0$, $Z_2=1/sC_2$, and $Z_3=R_3$ such that the input impedance is given by $Z_{in}=sC_2R_1R_3=sL$, where L represents an inductor given by $L=C_2R_1R_3$, and wherein a value of the inductor is tuned by a selection of a value of $C_2$, a value of $R_1$ and a value of $R_3$;
a tunable capacitance multiplier is configured by setting $Z_1=1/sC_1$, $R_1=0$, $Z_2=R_2$, $C_2=0$, and $Z_3=R_3$, such that the input impedance is given by $$Z_{in} = \frac{1}{sC_1\frac{R_2}{R_3}},$$

where the capacitance $C_1$ is multiplied by $R_2/R_3$, and an amount of multiplication of $C_1$ is tuned by a selection of a value of $R_2$ and a value of $R_3$; and
a tunable resistance multiplier is configured by setting $Z_1=R_1$, $C_1=0$, $Z_2=R_2$, $C_2=0$, and $Z_3=R_3$, such that the input impedance is given by $$Z_{in} = R_1\frac{R_3}{R_2},$$

where $R_1$ is multiplied by $R_3/R_2$, and an amount of multiplication of $R_1$ is tuned by a selection of a value of $R_2$ and a value of $R_3$; and
when the impedance input terminal, $Z_0$, is configured to be a negative input impedance terminal, an input impedance, $Z_{in}$, to the VCII is given by $$Z_{in} = -\frac{Z_1 Z_3}{Z_2},$$

any one of:
a tunable negative active inductor simulator is configured by setting $Z_1=R_1$, $C_1=0$, $R_2=0$, $Z_2=1/sC_2$, and $Z_3=R_3$ such that the input impedance is given by $Z_{in}=SC_2R_1R_3=sL$, where L represents an inductor given by $L=C_2R_1R_3$, and wherein a value of the inductor is tuned by a selection of a value of $C_2$, a value of $R_1$ and a value of $R_3$,
a tunable negative capacitance simulator is configured by setting $Z_1=1/sC_1$, $R_1=0$, $Z_2=R_2$, $C_2=0$, and $Z_3=R_3$, such that the input impedance is given by $$Z_{in} = -\frac{1}{sC_1\frac{R_2}{R_3}},$$

where the capacitance $C_1$ is multiplied by $R_2/R_3$, and an amount of multiplication of $C_1$ is tuned by a selection of a value of $R_2$ and a value of $R_3$, and
a tunable negative resistance simulator is configured by setting $Z_1=R_1$, $C_1=0$, $Z_2=R_2$, $C_2=0$, and $Z_3=R_3$, such that the input impedance is given by $$Z_{in} = -R_1\frac{R_3}{R_2},$$

where $R_1$ is multiplied by $R_3/R_2$, and an amount of multiplication of $R_1$ is tuned by a selection of a value of $R_2$ and a value of $R_3$.

* * * * *